United States Patent [19]
Frank

[11] 3,932,809
[45] Jan. 13, 1976

[54] DEFLECTOR GALVANOMETER
[75] Inventor: Lee F. Frank, Rochester, N.Y.
[73] Assignee: Eastman Kodak Company, Rochester, N.Y.
[22] Filed: May 28, 1974
[21] Appl. No.: 473,635

[52] U.S. Cl. ................ 324/96; 324/125; 324/154 R
[51] Int. Cl.² ...................................... G01R 31/00
[58] Field of Search .................. 324/96, 154 R, 125

[56] References Cited
UNITED STATES PATENTS

| | | | |
|---|---|---|---|
| 2,570,125 | 10/1951 | Hoare et al. | 324/125 X |
| 2,640,866 | 6/1953 | Powell | 324/154 R |
| 2,779,442 | 1/1957 | Bacon | 324/125 X |
| 3,102,233 | 8/1963 | Charbonneaux | 324/125 |

*Primary Examiner*—Stanley T. Krawczewicz
*Attorney, Agent, or Firm*—J. D. Husser

[57] ABSTRACT

A galvanometer structure is disclosed for high speed deflection of a light beam, such as that from a laser source. A flexible member is secured at one end in a mount of electrically insulating and magnetically inert material, for example, a plastic block. At the free end of the flexible member, a rotor is secured and this, in turn, has fixed thereto a reflecting element, such as a mirror. The flexible member also carries a variable magnetic field producing means which is arranged relative to the flexible member and at the back side of the mirror. A controllable variable current source is connected to the coil on the flexible member. A portion of the flexible member is reduced in cross section at a distance that is intermediate the ends thereof for greater flexibility in the direction of the reduced cross section. When the flexible member is caused to flex relative to the reduced cross section by a variable current applied to the coil, the mirror at the end and carried by the rotor moves therewith to cause a beam of light incident thereon to be deflected at an angle corresponding to the amount of flexure.

7 Claims, 6 Drawing Figures

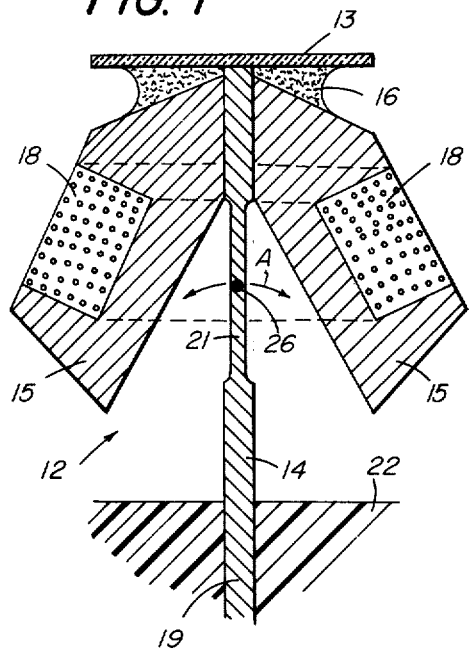
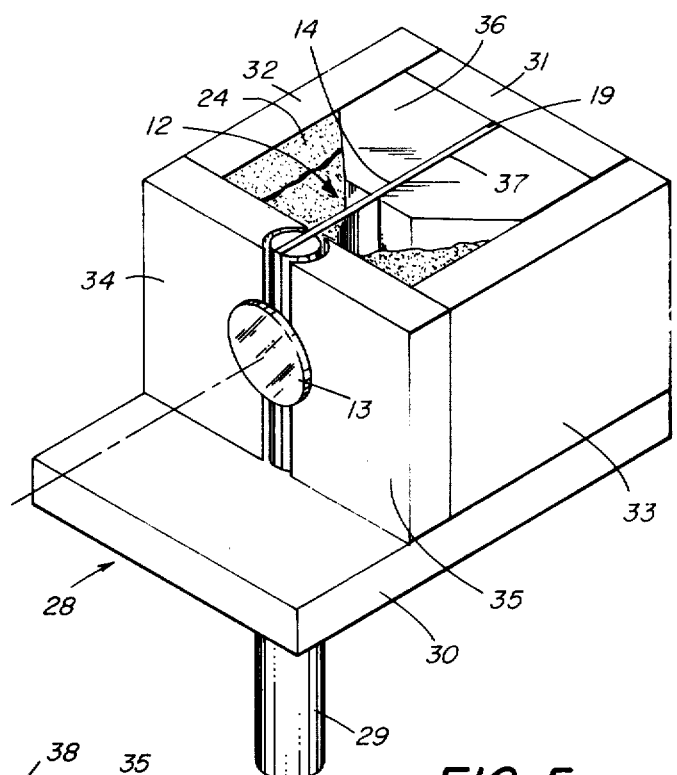
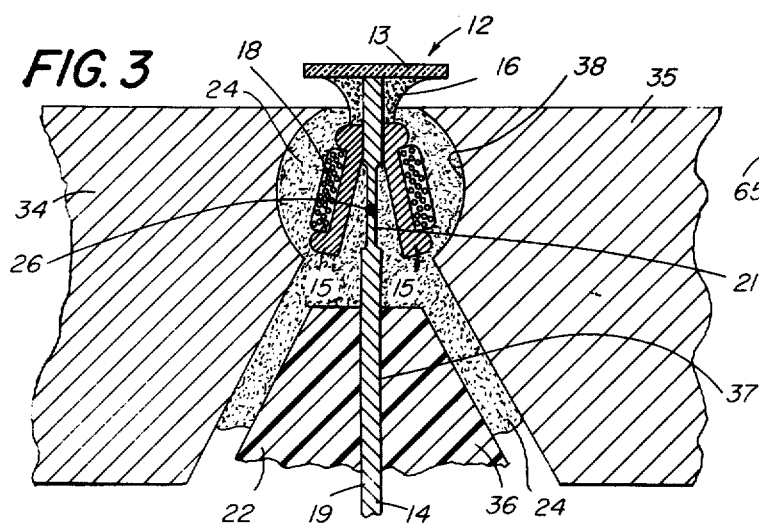
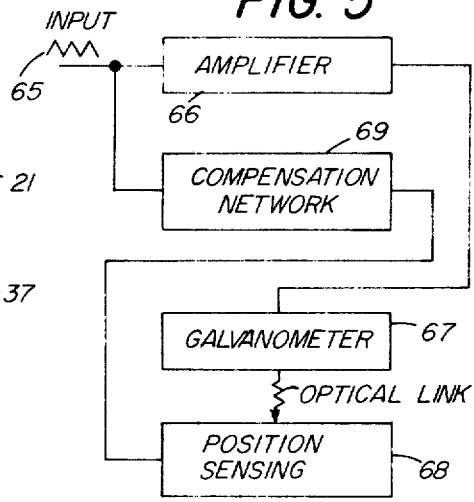
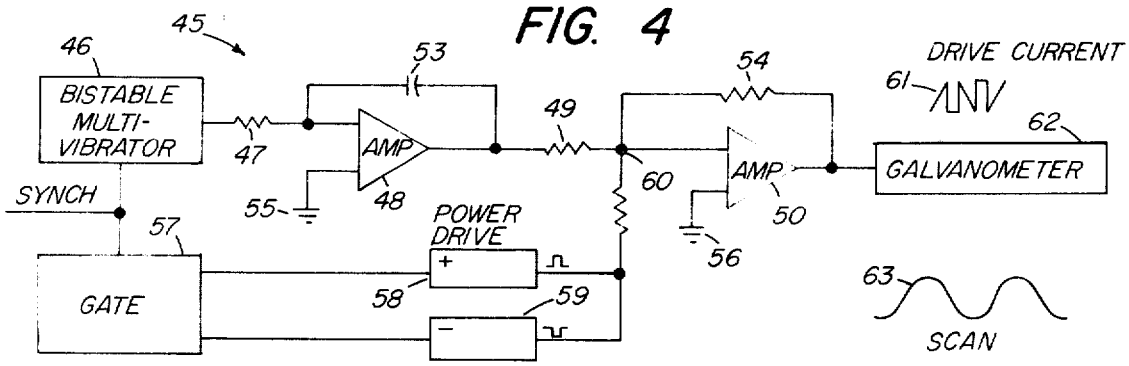

DEFLECTOR GALVANOMETER

FIELD OF THE INVENTION

The invention relates to a galvanometer and, more particularly, to a galvanometer that is suitable for use in high speed data recording and retrieval systems.

BACKGROUND OF THE INVENTION

Many prior art galvanometers are of the suspension type and rely on tortional stress to provide movement for angularly displacing a light-deflecting mirror. Such a galvanometer is chiefly used in measuring devices and is not adaptable to the high accuracy and speed requirements desired for use in conjunction with computers.

Laboratory galvanometers are also known in the prior art. However, this type of galvanometer also does not readily lend itself to the high speed systems required today for information storage and retrieval.

The most commonly used galvanometers have an operating life of about 100 hours at 700 to 1500 Hz. The operating precision and efficiency of such a galvanometer decreases as it is operated throughout this life span to the point where adjustments are continuously necessary in order to maintain an established accuracy within certain limits. This is one of the reasons why the use of a mirror- or a prism-wheel has been advocated because such a multiple-element arrangement avoids the problems encountered by galvanometers of presently known structure. Accordingly, there is a dire need for a galvanometer structure that will continuously and accurately operate over long periods of time without adjustment or degradation of image quality.

SUMMARY OF THE INVENTION

One object of the invention is to provide a galvanometer structure that can be readily used with a light modulating device and which is relatively simple to manufacture.

Another object of the invention is to provide a galvanometer structure which permits accurate deflection of a light beam incident thereon and which is capable of operating at very high speeds for use in the field of information storage and retrieval.

Another object of the invention is to provide a galvanometer that is capable of direct interfacing with a computer for reading out data, that is, with no intermediate buffer or storage device for the data being needed.

Another object of the invention is to produce a long wearing, electrically stable galvanometer which has an operating lifetime that is several orders of magnitude longer than that of presently known galvanometers.

Yet another object of the invention is to provide a galvanometer structure having only one moving part that is a flexible member specifically designed for a particular size mirror scan which can be readily ascertained by simple calculations and techniques known in the art.

These and other objects of the invention will be apparent to those skilled in the art when read in conjunction with the disclosure set forth hereinbelow.

In accordance with the invention, there is provided a galvanometer structure adapted for high speed deflection of a light beam, such as that from a laser source. In the galvanometer, a flexible member is secured at one end in a mount of electrically insulating and magnetically inert material, for example, a plastic block. At the free end of the flexible member, a rotor is secured and this, in turn, has fixed thereto a reflecting element, such as a mirror. The flexible member also carries a variable magnetic field producing means which is arranged relative to the flexible member and at the back side of the mirror. A controllable variable current source is connected to the coil on the flexible member. This component comprising the mirror, rotor and flexible member is arranged relative to a permanent magnet comprising soft iron poles of conventional galvanometer design, such that the rotor is within the electrical field produced by the pole pieces and with one end of the flexible member extending at least beyond the pole members and the electrical field produced thereby. A portion of the flexible member is reduced in cross section at a distance that is intermediate the ends thereof. This area of reduced cross section provides for greater flexibility in the direction of the reduced cross section. The area of reduced cross section is positioned or effected relative to the center of mass of the component so that the movement, when a varying current is applied to the coil, is about an axis of rotation which passes generally through the center of mass. When the varying current is applied to the coil, a magnetic field is produced which moves the flexible member because of the forces caused by the reaction of the varying magnetic field with the field produced by the surrounding permanent magnet. Thus, the flexible member is caused to flex, in the one allowable dimension, an amount corresponding to the variation in the magnetic field. When the flexible member flexes in this manner, the mirror carried by the rotor moves therewith to cause a beam of light incident thereon to be deflected at an angle corresponding to the amount of flexure.

BRIEF DESCRIPTION OF THE DRAWINGS

Reference is now made to the accompanying drawings wherein like referenced numerals and characters designate like parts and wherein:

FIG. 1 is a cross sectional view of a portion of the armature mirror assembly of a galvanometer in accordance with one embodiment of the invention;

FIG. 2 is a perspective view of the armature mirror assembly of the invention shown as positioned in a typical galvanometer housing;

FIG. 3 is a partial cross sectional view of a preferred embodiment of the invention showing the arrangement of the armature mirror assembly relative to the pole pieces;

FIG. 4 is a schematic diagram showing one type of circuitry that can be utilized for driving the galvanometer disclosed herein;

FIG. 5 is a schematic view showing a correction feedback system that can be incorporated in the galvanometer of the invention.

DESCRIPTION OF THE INVENTION

Figure 6:
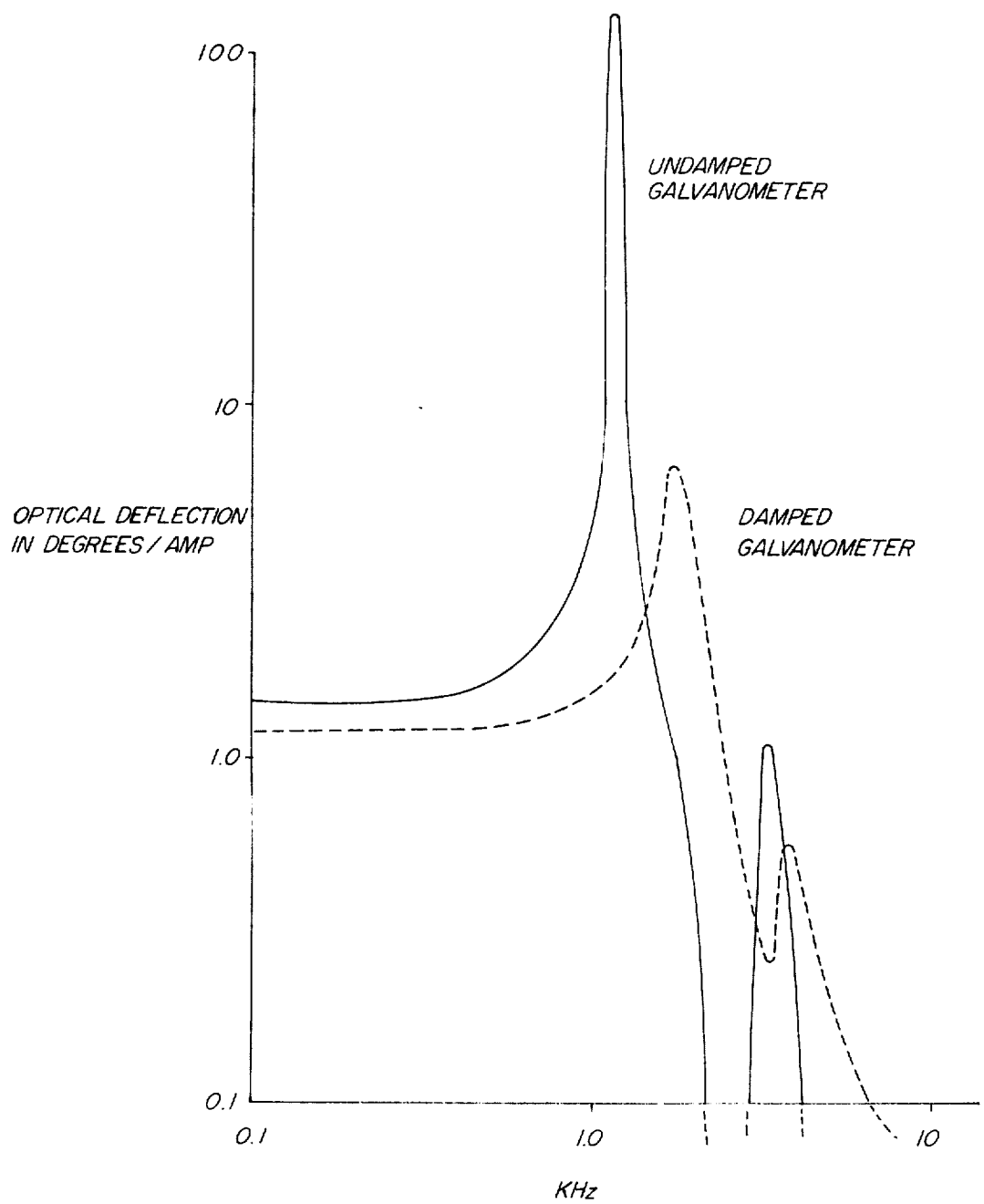
FIG. 6 is a graph showing the optical deflection of a galvanometer in accordance with the invention when damped and undamped in degress per ampere as a function of the driving voltage in kilohertz.

Reference is now made to the embodiment of the invention as disclosed more specifically in FIG. 1 of the drawings. The component or assembly designated by the numeral 12 comprises a mirror 13, a flexible member 14, and a variable magnetic field producing means comprising iron cores 15 and a coil 18 associated with each of the cores. Mirror 13 and cores 15 are fixed to the free end of the flexible member 14 by an adhesive, such as epoxy, designated by the numeral 16. The end 19 of flexible member 14 is secured in a block 22 of an electrically insulating and magnetically inert material, such as plastic. When an electromagnetically inert mount, such as one of plastic, is used, the flexing action of the flexible member 14 can be accurately established in accordance with any selected variation in the current applied to the coils 18. As shown in FIG. 1, the coils 18 are preferably formed by a continuous wire wound about the core-flexible-member arrangement. The coil 18 has lead lines, not shown, connecting the coil to a source of variable electric current, also now shown. It will be appreciated that the individual windings of coil 18 are also not shown for the sake of clarity. The flexible member 14 has an effective axis of rotation designated by the numeral 26 which is essentially perpendicular to the plane of the drawing and is located substantially at the center of mass of the component or assembly designated by the numeral 12. Since the flexible member does not bend only at one well defined point, the term "effective axis of rotation" has been used to serve as a designation of the central point about which flexure can be said to take place. Hence, when the term "axis of rotation" is used, it should be understood that the term refers to the "effective axis of rotation."

A portion 21 of the flexible member 14 that is generally intermediate the fixed and free ends thereof is reduced in cross section to provide greater sensitivity to flexure. It will be noted that the reduced cross section 21 is in the region in and about the axis of rotation 26 which, in effect, is also the center of mass of the total or complete component 12. The assembly or component 12 flexes about the axis of rotation 26 indicated by the doubleheaded arrow A. There is no movement in the direction perpendicular to the plane of the paper. As a result, the mirror 13 is moved and can be moved up to about 7° in each direction from its center or rest position. If the swing is greater than about 7°, the life of the flexible member 14 is shortened. A preferred swing is within the range of about 3° to about 5° in each direction.

As shown in FIG. 2, the component or assembly 12 shown in FIG. 1 can be positioned in a standard galvanometer-type housing. Such a housing, designated generally by the numeral 28, comprises a mounting stud 29 which is secured to a base plate 30. The plate 30 supports a base 31 of soft iron as well as magnets 32, 33 and pole pieces 34, 35 which are of the general shape and are arranged as shown in FIG. 2. Between the magnets 32 and 33, there is arranged plastic block 36 which is provided with a slit 37 in which the end 19 of the flexible member 14 is fixedly mounted in any well known manner. With reference to FIG. 1, the mirror 13 is shown in FIG. 2 in a position in which the angular deflection is in a horizontal plane. However, the galvanometer assembly can be mounted so as to place the mirror 13 in a position such that the deflection will be in a vertical or any other desired plane.

FIG. 3 discloses a preferred embodiment of the armature mirror component in accordance with the present invention. A plastic mount 22 is used because it does not have electrical or magnetic characteristics which would cause unwanted deviations in the applied variable and permanent magnetic fields.

Flexible member 14 is preferably made of spring steel but can be made of stainless steel, beryllium, spring brass, bronze spring stock, and the like. Spring steel is preferred because of the high quality etch obtainable and its superior resistance to fatigue, although it is not as corrosion resistant as some other metals. The flexible member 14 comprises spring steel 0.008 to 0.0015 inch thick except in its etched or reduced portion 21. The width of the hinge perpendicular to the paper is about one-half inch but can be from one-fourth to five-eighth inch, more or less, depending upon the weight of the mirror, coil and cores as well as the desired operating frequency. The thickness should be sufficient to support the weight of the assembly or component 12 during oscillation and can be determined by experimentation for a particular combination of elements. The mirror 13 can have a diameter of about 0.2 inches and a thickness of approximately 0.015 inches and is secured by an epoxy adhesive to the free end of the flexible member 14. The cores 15 are also secured to the free end of the flexible member 14 by an epoxy adhesive and set a short distance behind the mirror 13 to locate the center of mass of the components essentially on the effective axis of a rotation 26 of the member 14. The cores 15 are soft iron 0.080–0.100 inches long and have about 40 windings of No. 40 lacquered, copper wire. The outer surface of the armature 23 formed by cores 15 and coils 18 requires only sufficient clearance with respect to the concave edge 38 of each of the pole pieces 34, 35 to permit free movement thereof. The concave edges 38 are circular and concave to accommodate the armature 23 and have a diameter of the order of 0.100–0.120 inches. The plastic mount 22 clears the pole pieces 34, 35 by about 0.015 inches. The center of rotation 26 of the assembly or component 12 is located within a region of the flexible member 14 having a cross section parallel to the plane of the paper reduced to a thickness of the order of 0.001 inches, which is preferably obtained by selectively etching the region 21 near and about the effective axis of rotation 26 of the flexible member 14. The etched or bending region of member 14 is about 0.03–0.05 inches long.

The galvanometer as shown in FIGS. 2 and 3 can be damped by applying to the space between plastic block 36 and the soft iron cores 32, 33, and the pole pieces 34, 35 and/or around the coil wound cores 18, a damping agent, designated generally by the numeral 24, comprising silicone rubber diluted with about 50–75% dilutant of Freon 113, or a similar substance, Freon 113 being a refrigerant (trichlorotrifluoroethane) and a registered trademark of E. I. duPont de Nemours & Co.

The curves shown in FIG. 6 relate the optical deflection obtained with a galvanometer of the type shown in FIG. 4 with and without a damping agent. The undamped galvanometer is characterized by two resonant frequencies. The primary resonant frequency of about 1.18 KHz, that is the stronger resonance shown by B, the higher of the two peaks on the curve, is attributable to the fundamental rotary restoring force of the flexible member 14. The smaller or second peak C on the curve, appearing at about 3.15 KHz, indicates that a highly tuned, strong, secondary resonance appears as a small multiple of the fundamental frequency. Undesired higher frequency secondary resonance occurs because of the displacement of the axis of rotation from the center of mass of the assembly or component 12. It is apparent that the galvanometer as set forth hereinabove has a slightly inductive characteristic and a single strong resonance.

Because of the resonance, the incoming signal (current to coils 18) must be corrected to produce a desired movement of the member 14, such as a sinusoidal scan. This is usually accomplished by using an electrical wave-shaping network to generate a desired periodic wave form. Such a network for producing a selected input signal is shown in FIG. 4. A synchronization signal is applied to the wave forming circuit generally designated by the numeral 45 which comprises a bistable multivibrator 46 which provides an output signal through a resistor 47 to an operational amplifier 48. The amplifier 48 provides an output through a resistor 49 to a second operational amplifier 50. Amplifier 48 has a capacitor feedback network 53 and operational amplifier 50 has a resistor feedback 54. Each of the amplifiers 48 and 50 are grounded as indicated respectively at 55 and 56. The input synchronization signal is also transmitted to a gate 57 having positive and negative square wave outputs as represented by block 58 and 59, respectively. The resulting alternating square wave signal is imposed on the bistable multivibrator output at point 60. This circuitry generates a complex output signal represented by wave form 61 for driving the galvanometer indicated by the numeral 62. In response to the complex input wave form 61, the galvanometer 62 produces a substantially sinusoidal scan as represented by the output scan line 63.

The circuit shown in FIG. 5 can also be used to provide a selected scanning deflection. An input signal represented by the sawtooth wave form 65 is applied to an amplifier 66 which provides an output to a galvanometer 67 in accordance with the invention. With a position sensing device 68, the deflection of the galvanometer in response to the input signal is sensed and any resulting error signal is fed to a compensation network 69 which corrects the input signal to amplifier 66 to provide the desired scan. Position sensing devices in compensation networks are well known to those skilled in the art so that no further disclosure need be made at this point.

The flexible member 14, as shown in FIGS. 1 and 3, flexes about the effective axis of rotation 26. In accordance with the invention, the flexible member is of reduced bulk or cross section in the immediate proximity of such effective axis of rotation. This is done to reduce stiffness, stiffness being related to the cube of thickness. The bulk can be reduced by etching. By limiting the amount of flexure to about plus or minus 7° as the maximum movement relative to the zero or normal point, metal fatigue is essentially eliminated. The manner in which the portion 21 can be reduced in cross section by etching or other processes is well known to those skilled in the art and no further description thereof is deemed to be necessary.

The criteria for establishing spring failure is well established. For instance, if a spring will flex 1,000 times at twice its normal flexing rate, then spring failure is not directly related to the amount of use. The flexible members disclosed herein have been tested without a single failure for millions of cycles at twice the expected scan rate with and without damping.

The preferred deflection of the mirror 13 in the embodiment of the invention shown in FIGS. 1 and 3 is plus or minus 3° to plus or minus 5°. This sweep is sufficient for high speed data read-write applications. However, plus or minus 7° is available within the limitation of the construction of the galvanometer disclosed herein. In the preferred embodiment, unwanted stray modes of vibration are eliminated along the length of the flexible member 14. This is accomplished by establishing the center of mass of the assembly or component 12 relative to the effective axis of rotation 26. It is, of course, important that the mirror 13 be attached securely to the flexible member 14 so that it will not be subject to any movement other than that of the flexible member 14 and armature 23.

There is an optimum choice for mirror dimensions. The size, of course, depends upon the shape of the mirror, on the actual application, the torque to be placed upon the assembly or component, and the moments of inertia of the assembly and the mirror. The moment of inertia of the mirror 13 should be between about 0.200 and 0.333 of the moment of inertia of the assembly or component 12 to obtain the maximum number of resolvable spots in a scan.

There is an advantage in using a mirror that is plano on the reflecting surface and convex on its back so that the edges of the mirror are very thin. Also, a mirror that is wide perpendicular to the flexure but extremely narrow along the flexure axis is also advantageous. Both shapes provide a larger optical width for a given moment of inertia and deflection. Therefore, more resolvable spots are obtainable with such mirrors than with the simple biplanar disc mirror.

It will be appreciated that for extremely small armatures, the iron core can be eliminated and the coil can be formed about the hinge, an adhesive or polymer can then be used to make the assembly rigid. The loss of torque, because no ferromagnetic material is present, is compensated for by the reduction in the moment of inertia.

The invention has been described in detail with particular reference to certain preferred embodiments thereof but it will be understood that variations and modifications can be effected within the spirit and scope of the invention.

I claim:

1. In a galvanometer comprising means for producing a first magnetic field and a component having a center of mass and mounted at least partially within the first field for movement relative thereto, means associated with the component for producing a second magnetic field, and means associated with at least one of the magnetic field producing means for varying its respective magnetic field to control movement of the component, the improvement wherein:

the component comprises a flexible member fixedly mounted at one end without the first field and a rotor fixedly mounted on the other end within the first field, the rotor being moved angularly about an axis of rotation that passes generally through the center of mass and in response to interaction of the magnetic fields.

2. The galvanometer in accordance with claim 1 wherein the flexible member is provided with a portion of reduced cross section in the environs of the axis of rotation.

3. The galvanometer in accordance with claim 1 wherein the flexible member is a thin, elongated strip of resiliant metal having a portion of reduced cross-section intermediate the ends thereof.

4. The galvanometer in accordance with claim 3 wherein the portion of reduced cross section extends in the direction of the axis of rotation.

5. The galvanometer in accordance with claim 1 including means for surrounding and engaging at least that part of the component within the first field for damping the movement of the component.

6. The galvanometer in accordance with claim 5 wherein the damping means is a diluted solution of silicone rubber.

7. The galvanomter in accordance with claim 1 wherein a mirror is fixedly mounted on the rotor and angularly displaced relative to the center of mass with movement of the rotor.

\* \* \* \* \*